United States Patent [19]
Fang et al.

[11] Patent Number: 4,578,777
[45] Date of Patent: Mar. 25, 1986

[54] ONE STEP WRITE CIRCUIT ARRANGEMENT FOR EEPROMS

[75] Inventors: Sheng Fang, E. Palo Alto; Kameswara K. Rao, Santa Clara, both of Calif.

[73] Assignee: Signetics Corporation, Sunnyvale, Calif.

[21] Appl. No.: 512,858

[22] Filed: Jul. 11, 1983

[51] Int. Cl.[4] ............................................. G11C 11/34
[52] U.S. Cl. .................................... 365/184; 365/189
[58] Field of Search ............... 365/104, 182, 184, 185, 365/189, 194, 195

[56] References Cited

U.S. PATENT DOCUMENTS

| | | | |
|---|---|---|---|
| 4,090,258 | 5/1978 | Cricchi | 365/195 X |
| 4,149,270 | 4/1979 | Cricchi et al. | 365/184 |
| 4,354,256 | 10/1982 | Miyasaka | 365/189 |
| 4,377,857 | 3/1983 | Tickle | 365/189 |
| 4,477,884 | 10/1984 | Iwahashi et al. | 365/189 |

FOREIGN PATENT DOCUMENTS 54-137933 10/1979 Japan .................... 365/185

Primary Examiner—Joseph A. Popek
Attorney, Agent, or Firm—Robert T. Mayer

[57] ABSTRACT

A novel write circuit arrangement for an EEPROM type memory system operable in response to the difference between the information stored in each addressed cell and the information to the be stored therein during a writing cycle and writing information into only those addressed cells for which a difference exists regardless of whether the difference indicates to charge or discharge the cell. The arrangement also can simultaneously charge one cell of a byte while discharging another cell of the same byte.

28 Claims, 8 Drawing Figures

ONE STEP WRITE CIRCUIT ARRANGEMENT FOR EEPROMS

The invention relates to large scale integrated circuit memories. In particular, it relates to a new writing circuit arrangement for an EEPROM.

This application is related to U.S. patent application Ser. No. 512,853 entitled "Array Arrangement for EEPROMS" filed concurrently herewith, assigned to the same assignee as this application and incorporated by reference herein.

One type of EEPROM is described in the article by Johnson et al entitled "16-K EE-PROM Relies on Tunneling for Byte-Erasable Program Storage" publish in the February 28, 1980 issue of Electronics magazine. The memory disclosed in that article uses floating gate field effect transistors for its memory cells. In the arrangement disclosed in the article an individual cell of a particular byte can not be charged separately from the other cells of that byte. Thus, in order to charge any cell of a byte all cells of that byte have to be charged whether they are to remain in the charged state or not. This clears the selected byte and allows those selected ones of its cells which are not to remain in the charged state to be discharged as desired. This can require two cycles of operation in order to change information in any particular cell of a byte namely, an erasing cycle where all of the selected cells of the memory are charged and a programming cycle where chosen ones of the cells are discharged.

It is an object of this invention to be able to change information in a byte of an EEPROM array by writing into only those cells of the byte which require a change whether that change is from a discharged to a charged state or vice versa.

It is another object of the invention to be able to charge any individual cell of a byte of an EEPROM array while simultaneously being able to discharge any other cell of that byte.

One of the features of the invention is that it decreases the time required for a writing cycle.

One of the advantages of the invention is the increased life it provides for EEPROM arrays. Since only those cells whose information is to be changed go through a writing cycle, individual cells are subjected to charging and discharging cycles much less frequently.

In accordance with one aspect of the invention there is provided an improvement in a memory system of the EEPROM type which includes a plurality of memory cells arrayed in rows and columns. Each memory cell is capable of storing one bit of a data word. The memory system includes selecting means for simultaneously selecting more than one cell to enable information applied to said system to be written into said cells during a writing cycle and to be read from said cells during a reading cycle. The information stored in said cells is in either a first state or a second state. The improvement comprises writing means operating in response to the existence of a difference between the information stored in a selected cell and the information to be stored therein during a writing cycle. The writing means writes information only into those selected cells for which a difference exists. Such writing is executed in a cell regardless of whether the difference for that cell indicates a change form said first state to said second state or vice versa.

In accordance with another aspect of the invention there is provided in a memory system of the EEPROM type which includes a plurality of memory cells arrayed in rows and columns. Each memory cell is capable of storing one bit of a data word. The memory system includes a plurality of memory cells arrayed in rows and columns. Each memory cell is capable of storing one bit of a data word. The memory system includes selecting means for simultaneously selecting more than one cell to enable information applied to said system to be written into said cells during a writing cycle and to be read from said cells during a reading cycle. The information stored in said cells is in either a first state or a second state. The improvement comprises writing means writing information in said first state into one selected cell containing information in said second state while simultaneously writing information in said second state into another selected cell containing information in said first state.

Other objects, features and advantages of the invention will be apparent to those skilled in the art from the following description and appended claims when considered in conjunction with the accompanying drawing in which:

Figure 1:
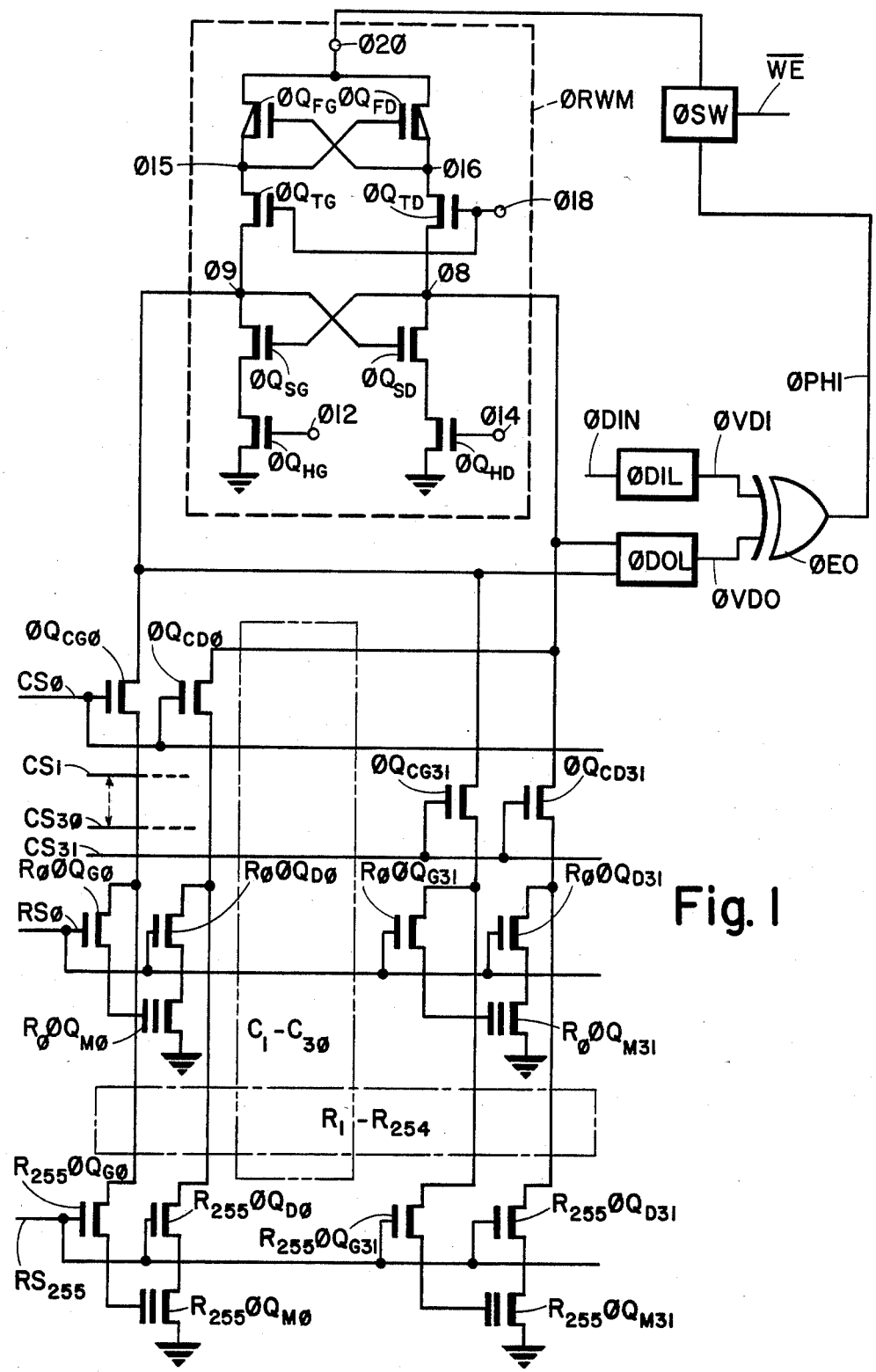
FIG. 1 is a simplified diagram of one of eight sections of an EEPROM array, each section containing 8192 memory cells arranged in 32 columns and 256 rows.

Referring to FIG. 1, there is shown therein a first of eight sections of an EEPROM array, each section containing 8192 memory cells arranged in 32 columns and 256 rows. Four floating gate field effect transistors $R_0 0 Q_{M0}$, $R_0 0 Q_{M31}$, $R_{255} 0 Q_{M0}$, and $R_{255} 0 Q_{M31}$ of the first section of the EEPROM array are illustrated. These transistors are the memory cell of the first row of the first column, the memory cell of the first row of the 32nd column and the memory cells of the 256th row, first column and 32nd column all of the first section. The memory cells of the second through 31st column of the first section are not shown for simplication purposes and are designated as the vertically disposed dotted line box marked C1-C30. Likewise the second through 255th rows of memory cells of the first section are also not shown for purposes of simplification and are designated as the horizontally disposed dotted line box identified as R1-R254.

Each of the memory cells of the first section is associated with two of its own row select conventional field effect transistors identified by the references $R_0 0 Q_{G0}$, $R_0 0 Q_{D0}$; $R_0 0 Q_{G31}$, $R_0 0 Q_{D31}$; $R_{255} 0 Q_{G0}$, $R_{255} 0 Q_{D0}$ and $R_{255} 0 Q_{G31}$, $R_{255} 0 Q_{D31}$ for the four illustrated cells.

All the memory cells in a column of the first section are associated with two column select field effect transistors, such as $0Q_{CG0}$, $0Q_{CD0}$ and $0Q_{CG31}$, $0Q_{CD31}$ for the first and 32nd columns.

Figure 2:
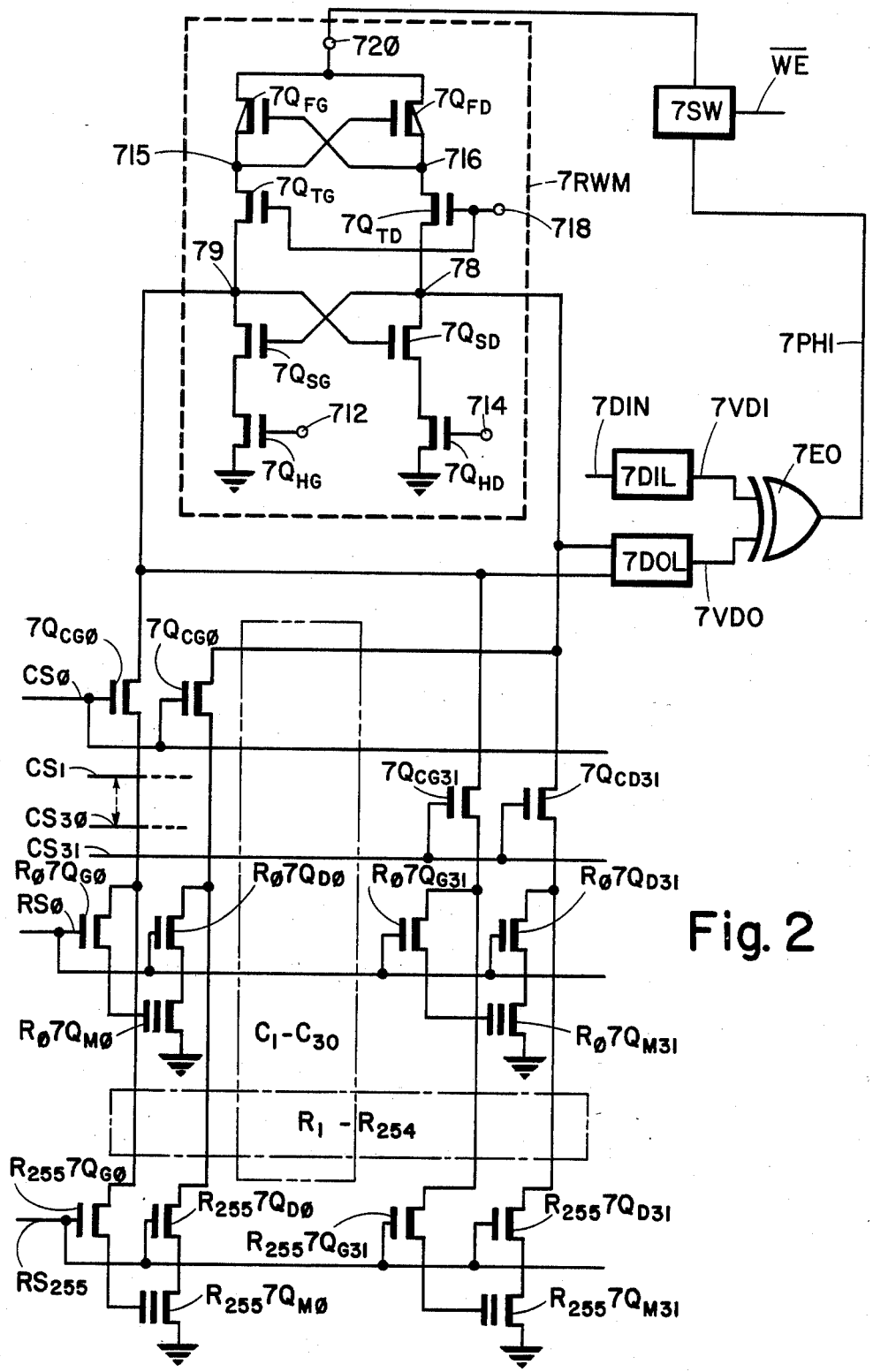
FIG. 2 is a simplified diagram of another one of the eight sections.

By referring to FIG. 2 it will be understood that there is shown therein identical memory cells as just described for the first section except that FIG. 2 shows the memory cells for the eighth section of the EEPROM array. Sections two through seven are not shown for simplification purposes, each being identical to sections one and eight. Each section contains one memory cell of each eight cell byte of the array. Thus by selecting the same row and column in each section one can read out or write into all eight cells of the associated byte.

For simplification purposes hereinafter each memory cell transistor will be designated as $Q_M$ and its associated conventional field effect transistor connected to its gate will be designated $Q_G$ for gate select transistor (see FIG. 3). The conventional field effect transistor whose source is connected to its associated memory cells drain will be designated $Q_D$ for drain select transistor. This disregards row location and column location. In each memory cell group the gate select transistor $Q_G$ has its drain connected to the column select line and its source connected to the gate of the floating gate memory cell transistor $Q_M$. The drain select transistor $Q_D$ of each cell group has its drain connected to column select line and its source connected to the drain of the memory cell floating gate transistor $Q_M$. The source of each memory cell transistor $Q_M$ is connected to ground. The gates of both the gate select transistor $Q_G$ and the drain select transistor $Q_D$ in each row in each column is connected to its associated row select line RS.

The drains of each gate select transistor $Q_G$ and each drain select transistor $Q_D$ are connected to lines 9 and 8, respectively, of reading and writing circuit RWM through associated column select transistors $Q_{CG}$ and $Q_{CD}$.

Reading and writing circuit RWM for each section comprises a gate column select circuit comprising transistors $Q_{FG}$, $Q_{TG}$, $Q_{SG}$ and $Q_{HG}$ and its complementary drain column select circuit including transistors $Q_{FD}$, $Q_{TD}$, $Q_{SD}$ and $Q_{HD}$.

Figure 3:
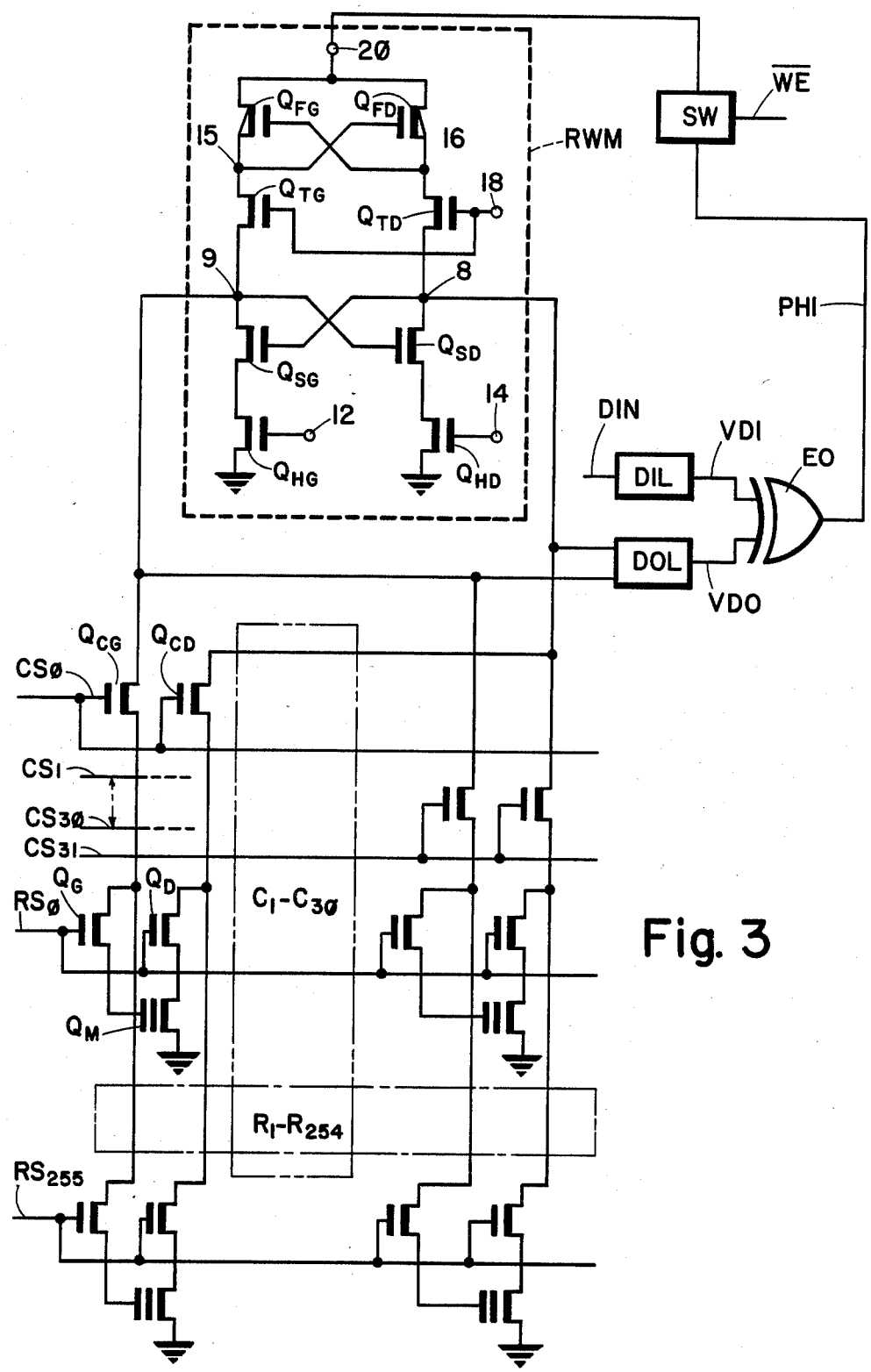
FIG. 3 is an exemplary diagram of one of the eight sections.

All transistors shown in FIG. 3 are field effect N-channel devices except for transistors $Q_{FG}$ and $Q_{FD}$ which are P-channel devices. These latter two transistors are arranged in a flipflop circuit and together with transistors $Q_{TG}$ and $Q_{TD}$ provide connections from terminal 20 to lines 8 and 9. As will be described later the flipflop circuit is in a first state to charge an associated memory cell and in a second state to discharge it. Transistors $Q_{SG}$ and $Q_{SD}$ provide a second flipflop circuit and these together with transistors $Q_{HG}$ and $Q_{HD}$ provide connections from lines 9 and 8 to ground.

Figure 4:
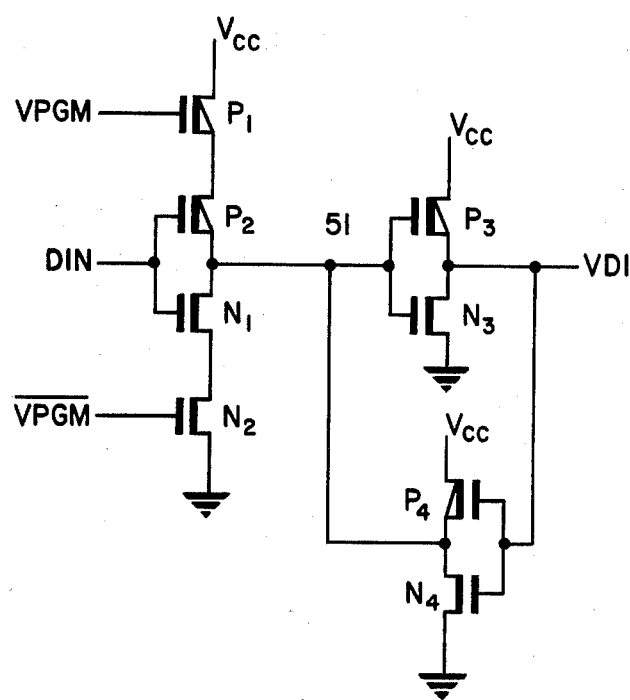
FIG. 4 is a detailed circuit diagram of one of the elements of FIG. 3.
Figure 5:
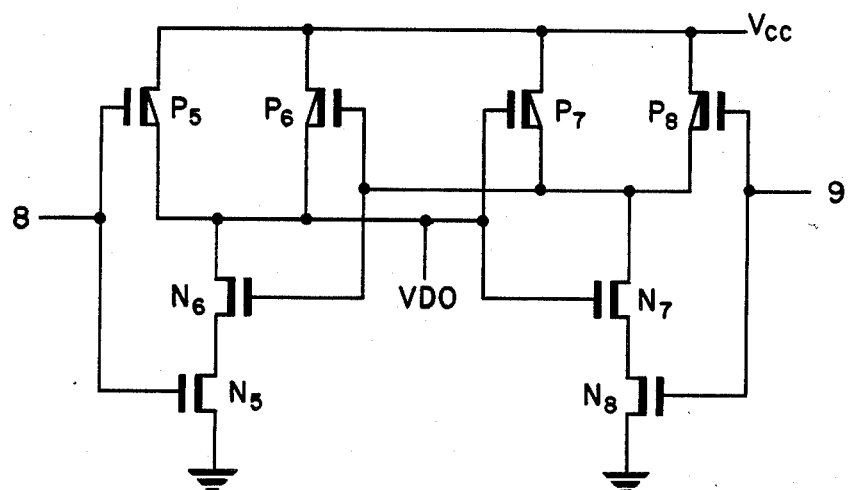
FIG. 5 is a detailed circuit diagram of another of the elements of FIG. 3.
Figure 6:
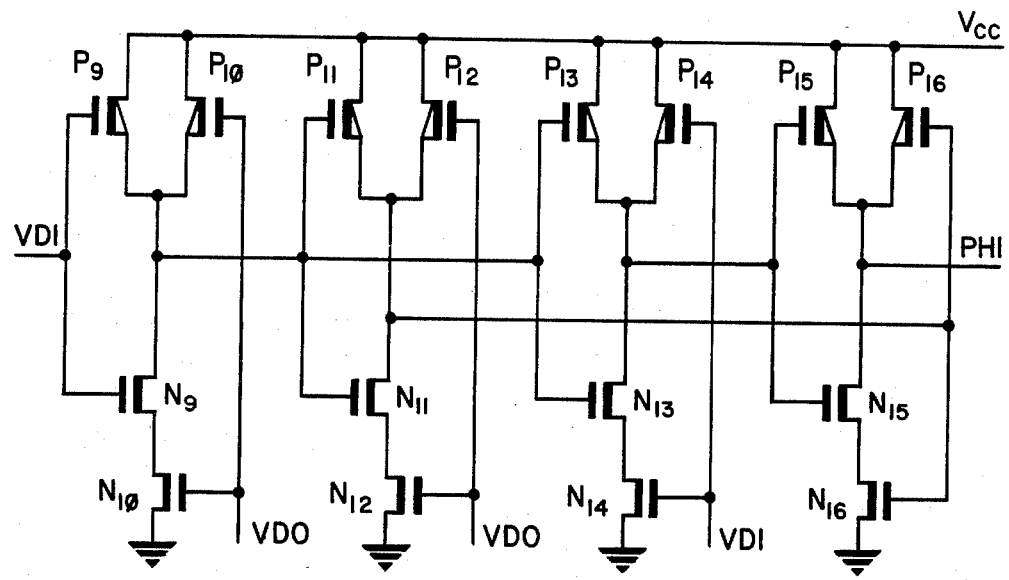
FIG. 6 is a detailed circuit diagram of still another of the elements of FIG. 3.

Also shown in FIG. 3 is a representative writing means for one section of the array including an input signal latch DIL and an output signal latch DOL. The inputs of output signal latch DOL are connected to lines 8 and 9 of reading and writing circuit RWM which is also part of the representative writing means. Output line VDO of the writing means is connected to one input of a comparison means comprising exclusive OR EO. The input of data input latch DIL is connected to data input line DIN and its output line VDI is connected to the second input of exclusive OAR EO. The output of the exclusive OR is connected to an input of switch SW. Another input is connected to line WE. The output from switch SW is connected to terminal 20 of reading and writing circuit RWM. It will simplify the explanation of the operation of data input latch DIL if it is understood that in accordance with the invention a writing operation is always preceded by a reading operation. This provides that feature of the invention which causes a writing operation to take place only if the data in a memory cell is to be changed. In addition, data input latch DIL only needs to be switched if the next input to a cell is different from the last input through the latch. Thus, if the last input switched the latch to place a binary 1 on line VDI, this caused N-channel gate N4 in FIG. 4 to turn on which maintains a binary 0 at terminal 51. This keeps P-channel gate P3 on and $V_{cc}$ potential (binary 1) stays on line VDI. Throughout the remainder of this description of FIGS. 4 through 7 N-channel gates are identified by the prefix letter N and P-channel gates by the prefix letter P.

If it is desired to change a cell from a binary 1 to a binary 0, the conditions recited above prevail when the reading cycle begins, except that a binary 0 appears on line DIN. This turns on P-channel gate P2 and maintains N-channel gate N1 off. During reading cycles the signal on line VPGM is low and this turns on P-channel gate P1. Thus $V_{cc}$ potential (binary 1) appears at terminal 51. This turns off gate P3 and turns on gate N3 placing ground potential (binary 0) on line VDI. Consequently gate N4 turns off and gate P4 turns on to maintains terminal 51 at the binary 1 level.

To change a cell from the binary 0 level to the binary 1 level, the conditions recited at the end of the paragraph above prevail when the reading cycle preceeding the writing cycle begins. Then a binary 1 appears on line DIN. This turns gate N1 on and maintains gate P1 off. During reading cycles line $\overline{VPG}$ is high and gate N2 also turns on. This puts ground potential (binary 0) at terminal 51. Consequently, gate N3 turns off and gate P3 turns on to apply $V_{cc}$ potential (binary 1) on line VDI. This turns off gate P4 and turns on gate N4 to keep ground potential (binary 0) at teminal 51.

Data output latch DOL (FIG. 5) provides a binary 1 signal along line VDO when line 8 is at binary 0 and line 9 is at binary 1. It provides a binary 0 signal along line VDO when line 8 is at binary 1 and line 9 is at binary 0. With a binary 0 on line 8 gate P5 (FIG. 5) is on and gate N5 is off. $V_{cc}$ potential (binary 1) is applied through gate P5 to line VDO and to gate N7 to turn it on. Gate N8 is on by virtue of the binary 1 on line 9. Therefore, ground potential (binary 0) is applied to gate P6 to turn it on. As a result, $V_{cc}$ potential (binary 1) is maintained on line VDO through gate P6.

In the alternative condition with line 8 high and line 9 low, gates N5, N6 and P8 are turned on to apply ground potential (binary 0) to line VDO.

Exclusive OR EO produces a binary 1 signal if either one but only one of its input lines VDI or VDO carry a binary 1. In all other conditions it provides a binary 0 for its output line PHI. Assuming a binary 1 applied along VDI and a binary 0 along VDO, gate P10 (FIG. 6) is turned on to apply a binary 0 to gate N13 to turn it on. At the same time gate N14 is on and ground or binary 0 is applied through it and gate N13 to gate P15 to turn it on which applies a binary 1 along line PHI. If binary 1 signals appear along both lines VDI and VDO gates N9 and N10 are both turned on applying binary 0's to gates P10 and P13 to turn them on also. One applies a binary 1 to gate N16 and the other to gate N15 turning both on to apply ground potential (binary 0) along line PHI.

If binary 0's are applied along both line VDI and VDO, gates P12 and P14 are both turned on to apply binary 1 signals to gates N15 and N16. These both turn on again to apply a binary 0 along line PHI.

If a binary 0 is applied along line VDI and a binary 1 along line VDO, gate P9 is turned on to apply a binary 1 to gate N11 turning it on. Gate N12 is turned on by the binary 1 along line VDO. These connect ground to gate P16 turning it on to apply $V_{cc}$ potential (binary 1) to line PHI.

Figure 7:
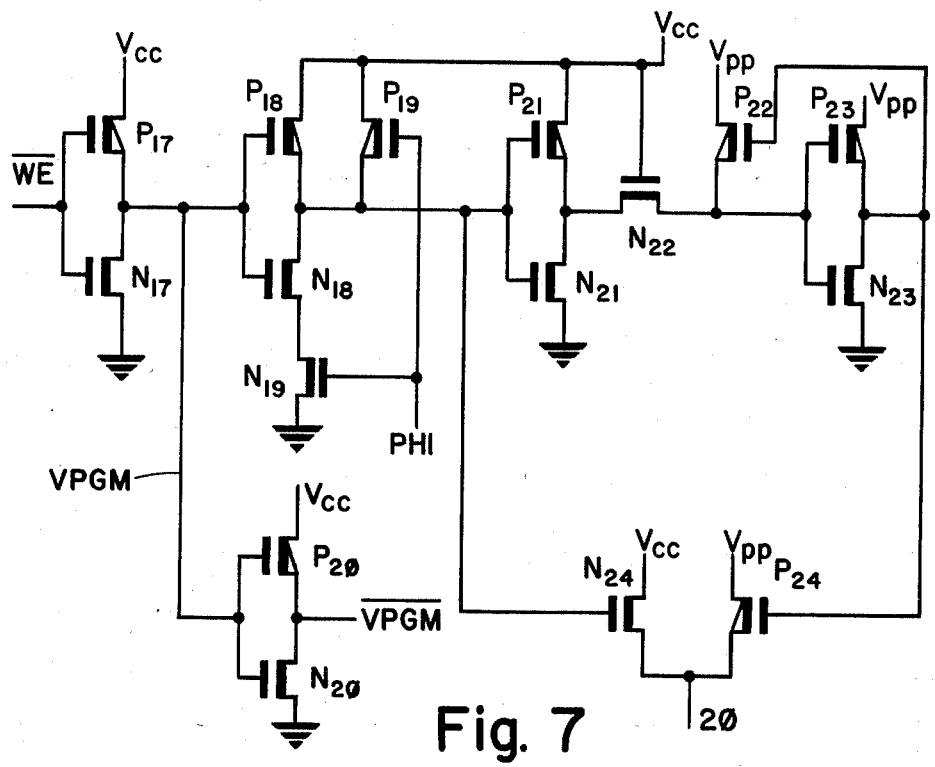
FIG. 7 is a detailed circuit diagram of yet another of the elements of FIG. 3.

Shown in FIG. 7 is the detailed circuitry of switch SW for transferring the voltage applied to terminal 20 of reading and writing circuit RWM from the reading potential $V_{cc}$ to the writing potential $V_{pp}$. A signal applied along line $\overline{WE}$ is inverted by the inverter formed by gates P17 and N17. A binary 1 signal along line $\overline{WE}$ indicates a reading operation and causes a binary 0 to be applied along line VPGM. The inverter formed by gates P20 and N20 inverts this to apply a binary 1 along line $\overline{VPGM}$. Under these conditions gate P18 is turned on and a binary 1 is applied to gates N21 and N24 turning them on. Gate N21 applies ground to gate P23 turning gate P23 on and gates P22 and P24 off. Gate N24 applies $V_{cc}$ potential (reading voltage) to terminal 20 of reading and writing circuit RWM.

When a writing operation is desired line VPGM goes high and line $\overline{VPGM}$ goes low but without effect if line PHI remains at a binary 0 indicating a change in information is not needed in its associated memory cell.

Assuming a change in information is desired when VPGM goes high gate N18 is turned on. When PHI goes high gate N19 is turned on and ground potential is applied to both N21 and N24 turning both off. This removes $V_{cc}$ potential from terminal 20 of reading and writing circuit RWM. The ground applied through gates N18 and N19 turns gate P21 on which, in turn, turns gate P23 off and gate N23 on. This applies ground potential to gate P24 turning it on and applying the writing potential $V_{pp}$ to terminal 20 of the reading and writing circuit RWM.

Figure 8:
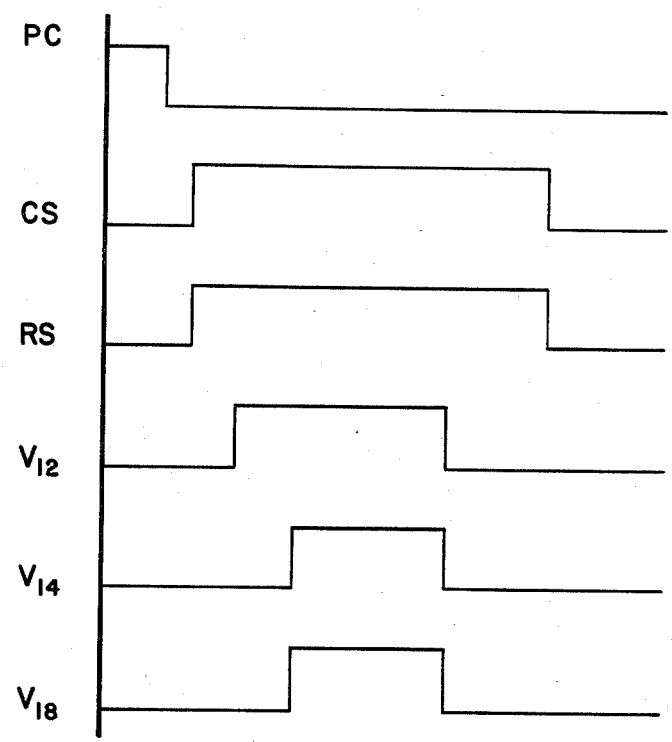
FIG. 8 is a timing circuit of some of the pulses used in performing the reading and writing cycles of the described memory.

The operation of one memory cell will now be described with reference to FIG. 3. To read a particular cell as is well known, a select voltage is applied to the column select line associated with that cell as well as to the row select line associated with that cell thereby addressing or selecting the cell. It is to be understood that the same row select line and column select line is simultaneously selected in each of the eight sections thereby addressing the whole byte. That is the only row select line and column select line so selected in each section and thus only one cell is selected in each section. Assume row zero and column zero to have been so selected, the select voltages (source not shown) cause transistors $Q_G$ and $Q_D$ together with transistors $Q_{CG}$ and $Q_{CD}$ to turn on. Also assume the floating gate of transistor $Q_M$ to be discharged, then this memory cell is in a first state which will be designated as having a binary 1 stored in it. As a consequence line 8 is at the ground potential of the source of transistor $Q_M$ when it ($Q_M$) is turned on by the voltage applied through transistor $Q_G$ from line 9 by the precharging of that line. (The precharging operation is not described as it is a well known operation to those skilled in the art.) At this time a reading voltage $V_{CC}$ is applied to terminal 20 from switch SW, as previously explained in connection with FIG. 7. When voltage $V_{12}$ is applied in any known manner to terminal 12 transistor $Q_{HG}$ is turned on but line 9 remains high because transistor $Q_{SG}$ remains off because of the low voltage applied to its gate from line 8. Thereafter when voltage $V_{14}$ (FIG. 8) is applied in any well known manner to terminal 14 transistor $Q_{HD}$ turns on and it and transistor $Q_{SD}$ (which has been turned on by the voltage at line 9) provide a path to ground for line 8. Subsequently, $V_{18}$ (FIG. 8) is applied to terminal 18 in any well known manner to turn on both transistors $Q_{TG}$ and $Q_{TD}$. As a consequence terminal 15 goes high to the voltage of line 9 and terminal 16 goes low to the ground potential of line 8. This turns transistor $Q_{FG}$ on and applies voltage $V_{CC}$ to line 9 to maintain it at a high potential. A voltage differential with line 8 at a lower potential than line 9 indicates the storing of a binary 1 in transistor $Q_M$. This is signified by a binary 1 output from data output latch DOL along line VDO, as explained in connection with FIG. 5. This output along line VDO is applied to the lower input of exclusive OR EO without effect.

If the floating gate of memory cell $Q_M$ had been charged at the time the reading operation had started to indicate it in its second state, i.e. the storing of a binary 0 the cell would not conduct when the row select voltage was applied to line $RS_0$. As a result line 8 would remain high due to the precharging voltage. Therefore, transistor $Q_{SG}$ would be turned on. Consequently when voltage $V_{12}$ is applied to transistor $Q_{HG}$ to turn it on, a path to ground through transistors $Q_{SG}$ and $Q_{HG}$ is provided for line 9. Thus transistor $Q_{SD}$ is turned off by the ground potential along line 9 and when voltage $V_{14}$ is applied to transistor $Q_{HD}$ its turning on would be without effect. When voltage $V_{18}$ is applied to terminal 18 to turn on transistors $Q_{TG}$ and $Q_{TD}$, under these circumstances, terminal 15 would go to ground potential while terminal 16 remained high. The ground potential at terminal 15 would turn transistor $Q_{FD}$ on this time and the potential $V_{CC}$ applied to terminal 20 is in this case applied to line 8. A voltage differential with line 9 at a lower potential than line 8 indicates the storing of a binary 0 in the memory cell and, as explained causes data output latch DOL to produce a binary 0 from its output to be applied along line VDO to the lower input of exclusive OR EO. The operation of exclusive OR EO is without effect during a reading operation and can be ignored.

If a writing cycle is to take place the reading cycle as just explained is conducted preliminary to the writing operation. During a writing cycle a binary 0 or a binary 1 is applied along line DIN to data input latch DIL. As explained in connection with FIG. 4. either of these signals causes data input latch DIL to produce the corresponding signal at its output and apply it along line VDI to the upper input of exclusive OR EO. Since a writing operation is necessary only if the data in the memory cell is to be changed exclusive OR EO is used to determine this requirement. As explained in connection with FIG. 6, if the data stored in a memory cell is the same as that applied along line DIN either two zeros or two ones are applied along lines VDI and VDO to the inputs of exclusive OR EO. In either case a binary 0 is applied from the output of exclusive OR EO along line PHI to switch SW. This prevents a writing cycle from commencing since it is not needed in view of the fact that the information in the associated cell is not going to be changed.

Assuming a binary 1 is stored in transistor $Q_M$ and that a binary 0 is to be stored therein. Line 8 is low with respect to line 9 during the $V_{18}$ pulse and as a consequence a binary 0 signal is applied along line VDI to the upper input of exclusive OR EO and a binary 1 is applied along line VDO to its lower input. This causes an output signal to be applied along line PHI to switch SW causing it (as previously explained in connection with FIG. 7) to transfer the voltage on terminal 20 from the reading voltage $V_{CC}$ to the higher writing voltage $V_{PP}$ when the writing cycle is initiated by the signal along line $\overline{WE0}$ going low. The writing voltage $V_{pp}$ is applied through transistor $Q_{FG}$ and transistor $Q_{TG}$ to line 9 and through transistors $Q_{CG}$ and $Q_G$ to the gate of memory cell transistor $Q_M$. With its gate at the writing voltage potential and its source and drain both at ground potential the floating gate of transistor $Q_M$ is charged to change the information stored therein to a binary 0.

Assuming a binary 0 is stored in transistor $Q_M$ and that a binary 1 is to be written therein, line 8 is high with respect to line 9 when the pulse $V_{18}$ is applied to terminal 18. As a consequence data output latch DOL applies a binary 0 to the lower input of exclusive OR EO along line VDO while the data input latch DIL applies a binary 1 to its upper input along line VDI. Again switch SW applies the writing voltage $V_{pp}$ terminal 20 in place of the reading voltage $V_{CC}$. This time, however, transistor $Q_{FG}$ is turned off and transistor $Q_{FD}$ is turned on as previously explained during the reading cycle operation. The writing voltage is thereby applied through transistor $Q_{FD}$ and transistor $Q_{TD}$ to line 8 and through transistors $Q_{CD}$ and $Q_D$ to the drain of memory cell transistor $Q_M$. With the writing voltage on its drain and the ground potential of line 9 applied through transistors $Q_{CG}$ and $Q_G$ on its gate the floating gate of memory cell transistor $Q_M$ is discharged. It thereafter stores a binary 1.

By comparing FIG. 1 with FIG. 2 it can be seen that when column "0" and row "0" are selected both the memory cell $R_{00}Q_{M0}$ of the first section of the array (FIG. 1) and memory cell $R_07Q_{M0}$ of the eighth section (FIG. 2) are simultaneously selected. Since each memory cell has its own writing means it can be seen that line 09 can be high or low with respect to line 08 of FIG. 1 independent of the relationship between line 79 and line 78 of FIG. 2. The same can be said for the other six bits of each byte. Because of this separation of each of the bits of every byte into separate sections it can be seen that the writing means of each section is operable during a writing cycle to write information in either state into a selected cell of a byte or not independently of the other selected cells of that byte.

With this arrangement it can be further seen that exclusive OR EO of the writing means of each section of the array enables the writing voltage to be applied only to the reading and writing circuit RWM associated with a cell where information is to be changed. This prevents such cells from being written into when not necessary.

Moreover, the separation of each of the bits of every byte into separate sections enables the writing circuits to write information in a first state into one selected cell containing information in a second state while simultaneously writing information in the second state into another selected cell containing information in said first state. Thus, assume the memory cell in a first bit position of column zero, row zero, namely $R_00Q_{M0}$ (FIG. 1) has a binary 1 stored therein while the memory cell in the eighth bit position of column zero, row zero, namely $R_07Q_{M0}$ (FIG. 2) has a 0 stored therein. With the present invention the former can be changed to a binary 0 during a writing cycle and the latter to changed to a binary 1 simultaneously during the same writing cycle.

From the foregoing it is to be understood that various modifications to the above described arrangement of the invention will be evident to those skilled in the art. The arrangement described herein is for illustrative purposes and is not to be considered restrictive.

What is claimed is:

1. In a memory system of the EEPROM type which includes a plurality of memory cells arranged in rows and columns, each memory cell capable of storing one bit of a data word and selecting means for simultaneously selecting more than one cell to enable information applied to said system to be written into said selected cells during a writing cycle and to be read from said cells during a reading cycle, said information being stored in said cells in either a first state or a second state, the improvement comprising writing means operating in response to the existence of a difference between the information stored in each selected cell and the information to be stored therein during a writing cycle and simultaneously writing information into only those selected cells for which a difference exists, said writing being executed regardless of whether such difference indicates a change from said first state to said second state or vice versa, said data words comprising bytes memory, each byte being associated with a separate plurality of memory cells and said writing means including a separate writing circuit associated with each cell of a byte, each writing circuit including a flip-flop circuit which is in a first state at the start of a writing operation to conduct current in a first direction and write information in said first state into an associated cell and in a second state at the start of a writing operation to conduct current in a second direction and write information in said second state into an associated cell.

2. In a memory system according to claim 1, wherein said writing means includes reading means operable to read the information stored in each cell.

3. In a memory system according to claim 2, wherein said writing means includes comparison means (EO) operable during a writing cycle and comparing the information stored in each selected cell with the information to be stored therein.

4. In a memory system according to claim 3, wherein said comparison means terminates the writing cycle of each cell if the information to be stored in it during said cycle is the same as already stored in it.

5. In a memory system according to claim 4, wherein the flipflop circuit associated with a particular cell is set to said first state ($Q_{FDon}$) when the associated cell has information stored in it in said second state (charged) at the start of a writing operation and set to said second state ($Q_{FGon}$) when the associated cell has information stored in it in said first state (discharged) at the start of said writing operation.

6. In a memory system according to claim 5, wherein each memory cell includes a floating gate type field effect transistor ($Q_M$) and each writing circuit operates during a writing cycle to discharge the floating gate of an associated charged cell in which information in said first state is to be stored and to charge the floating gate of an associated discharged cell in which information in said second state is to be stored.

7. In a memory system according claim 6, wherein each memory cell includes a pair of conventional field effect transistors ($Q_G$, $Q_D$) connected to said floating gate transistor to conduct current in said first direction from its associated writing circuit to discharge its associated floating gate and in said second direction to charge it.

8. In a memory system according to claim 7, wherein the three field effect transistors of each cell each comprises a source, a gate and a drain, the source of said one conventional field effect transistor ($Q_G$) being connected to the gate of said floating gate transistor ($Q_M$) and the source of said other conventional field effect transistor ($Q_D$) being connected to the drain of said floating gate transistor, the source of which is grounded, said selecting means turning on both said conventional transistors when the associated memory cell is to be written into and said associated writing circuit raising the voltage applied to the drain of said one conventional transistor ($Q_G$) above the voltage applied to the drain of said other conventional transistor ($Q_D$) thereby causing said floating gate to charge when information in said second state is to be stored in said cell and it has information in said first state stored in it, said associated writing circuit raising the voltage applied to the drain of said other conventional transistor ($Q_D$) above the voltage applied to the drain of said one conventional transistor ($Q_G$) thereby causing said floating gate to discharge when information in said first state is to be stored in said cell and it has information in said second state stored in it.

9. In a memory system according to claim 8, wherein each of said writing circuits includes a second flipflop circuit ($Q_{SG}$, $Q_{SD}$) set to a first state ($Q_{SD}$ on) when the floating gate of said cell is discharged and to a second state ($Q_{SG}$ on) when the floating gate of said cell is charged.

10. In a memory system according to claim 9, wherein said second flipflop circuit in said first state provides a conducting path to ground for the source and drain of said other conventional field effect transistor ($Q_D$) and in said second state provides a conducting path to ground for the source and drain of said one of said field effect transistors ($Q_G$).

11. In a memory system of the EEPROM type which includes a plurality of memory cells arranged in rows and columns, each memory cell capable of storing one bit of a data word and selecting means for simultaneously selecting more than one cell to enable information applied to said system to be written into said cells during a writing cycle and to be read from said cells during a reading cycle, said information being stored in said cells in either a first state or a second state, the improvement comprising writing means operable during a writing cycle and writing information in said first state into one selected cell containing information in said second state while simltaneously writing information in said second state into another selected cell containing information in said first state, said data words comprising bytes of memory, each byte being associated with a separate plurality of memoyy cells and said writing means including a separate writing circuit associated with each cell of a byte, each writing circuit including a flip-flop circuit which is in a first state at the start of a writing operation to conduct current in a first direction to enable information in said first state to be stored in its associated cell during that operation and in a second state at the start of a writing operation to conduct current in a second direction to enable information in said second state to be stored in its associated cell during that operation.

12. In a memory system according to claim 11, wherein the flipflop circuit associated with a particular cell is set to said first state ($Q_{FDon}$) when the associated cell has information stored in it in said second state at the start of a writing operation and set to said second state ($Q_{FGon}$) when the associated cell has information stored in at said first state (discharged) at the start of said writing operation.

13. In a memory system according to claim 12, wherein each memory cell includes a floating gate type field effect transistor ($Q_M$) and each writing circuit operates during a writing cycle simultaneously to discharge the floating gate of a cell in which information in said first state is to be stored and to charge the floating gate of a cell in which information in said second state is to be stored.

14. In a memory system according to claim 13, wherein each memory cell includes a pair of conventional field effect transistors ($Q_G$, $Q_D$) connected to its associated floating gate transistor to conduct current in said first direction from its associated writing circuit to charge its associated floating gate and in said second direction to discharge it.

15. In a memory system according to claim 14, wherein the three field effect transistors of each cell each comprises a source, a gate and a drain, the source of said one conventional field effect transistor ($Q_G$) being connected to the gate of said floating gate transistor ($Q_M$) and the source of said other conventional field effect transistor ($Q_D$) being connected to the drain of said floating gate transistor, the source of which is grounded, said selecting means turning on both said conventional transistors when the associated memory cell is to be written into and the associated writing circuit raising the voltage applied to the drain of said one conventional transistor ($Q_G$) above the voltage applied to the drain of said other conventional transistor ($Q_D$) thereby causing said floating gate to charge when information in said second state is to be stored in said cell and it has information in said first state stored in it, said writing means raising the voltage applied to the drain of said other conventional transistor ($Q_D$) above the voltage applied to the drain of said one conventional transistor ($Q_G$) thereby causing said floating gate to discharge when information in said first state is to be stored in said cell and it has information in said second state stored in it.

16. In a memory system according to claim 15, wherein said writing means includes reading means operable to read the information stored in each cell.

17. In a memory system according to claim 16, wherein each of said reading means includes a second flipflop circuit ($Q_{SG}$, $Q_{SD}$) set to a first state ($Q_{SDon}$) during reading of its associated cell when the floating gate of said cell is discharged and to a second state ($Q_{SGon}$) during reading of its associated cell when the floating gate of said cell is charged.

18. In a memory system according to claim 17, wherein said second flipflop circuit in said first state provides a conducting path to ground for the source of said other conventional field effect transistor ($Q_D$) and in said second state provides a conducting path to ground for the source of said one of said field effect transistors ($Q_G$).

19. In a memory system according to claim 11, wherein said writing means operates in response to the existence of a difference between the information stored in each addressed cell and the information to be stored therein during a writing cycle and writing information into only those addressed cells for which a difference exists, said writing being executed regardless of whether such difference indicates a change from said first state to said second state or vice versa.

20. In a memory system according to claim 19, wherein said writing means includes reading means operable to read the information stored in each cell.

21. In a memory system according to claim 20. wherein said writing means includes comparison means (EO) operable during a writing cycle and comapring the information stored in each selected cell with the information to be stored therein.

22. In a memory system according to claim 21, wherein said comparison means terminates the writing cycle of each cell if the information to be stored in it during said cycle is the same as already stored in it.

23. In a memory system according to claim 22, wherein the flipflop circuit associated with a particular cell is set to said first state ($Q_{FDon}$) when the associated cell has information stored in it in said second state (charged) at the start of a writing operation and set to said second state ($Q_{FGon}$) when the associated cell has information stored in it in said first state (discharged) at the start of said writing operation.

24. In a memory system according to claim 23, wherein each memory cell includes a floating gate type field effect transistor ($Q_M$) and each writing circuit operates during a writing cycle to discharge the floating gate of an associated charged cell in which information in said first state is to be stored and to charge the floating gate of an associated discharged cell in which information in said second state is to be stored.

25. In a memory system according claim 24, wherein each memory cell includes a pair of conventional field effect transistors ($Q_G$, $Q_D$) connected to its associated floating gate transistor to conduct current in said first direction from its associated writing circuit to charge its associated flating gate and in said second direction to discharge it.

26. In a memory system according to claim 25, wherein the three field effect transistors of each cell each comprises a source, a gate and a drain, the source of said one conventional field effect transistor ($Q_G$) being connected to the gate of said floating gate transistor ($Q_M$) and the source of said other conventional field effect transistor ($Q_D$) being connected to the drain of said floating gate transistor, the source of which is grounded, said selecting means turning on both said conventional transistors when the associated memory cell is to be written into and said associated writing circuit raising the voltage applied to the drain of said one conventional transistor ($Q_G$) above the voltage applied to the drain of said other conventional transistor ($Q_D$) thereby causing said floating gate to charge when information in said second state is to be stored in said cell and it has information in said first state stored in it, said associated writing circuit raising the voltage applied to the drain of said other conventional transistor ($Q_D$) above the voltage applied to the drain of said one conventional transistor ($Q_G$) thereby causing said floating gate to discharge when information in said first state is to be stored in said cell and it has information in said second state stored in it.

27. In a memory system according to claim 26, wherein each of said writing circuits includes a second flipflop circuit ($Q_{SG}$, $Q_{SD}$) set to a first state ($Q_{SD}$ on) when the floating gate of said cell is discharged and to a second state ($Q_{SG}$ on) when the floating gate of said cell is charged.

28. In a memory system according to claim 27, wherein said second flipflop circuit in said first state provides a conducting path to ground for the source and drain of said other conventional field effect transistor ($Q_D$) and in said second state provides a conducting path to ground for the source and drain of said one of said field effect transistors ($Q_G$).

* * * * *